(12) United States Patent
Inoue

(10) Patent No.: US 6,917,101 B2
(45) Date of Patent: Jul. 12, 2005

(54) APPARATUS CARRYING ELECTRONIC DEVICE

(75) Inventor: Hisayuki Inoue, Kokubu (JP)

(73) Assignee: Kyocera Corporation, Kyoto (JP)

(*) Notice: Subject to any disclaimer, the term of this patent is extended or adjusted under 35 U.S.C. 154(b) by 37 days.

(21) Appl. No.: 10/615,680

(22) Filed: Jul. 8, 2003

(65) Prior Publication Data

US 2004/0007711 A1 Jan. 15, 2004

(30) Foreign Application Priority Data

Jul. 9, 2002 (JP) ........................................ 2002-200395

(51) Int. Cl.[7] ............................. H01L 23/48; H03H 7/38
(52) U.S. Cl. ..................... 257/690; 257/100; 257/775; 257/798; 333/32; 333/33
(58) Field of Search ................................. 257/100, 648, 257/778, 787, 690, 798, 684; 333/32, 33, 187, 193; 361/776, 777, 778, 779; 310/313, 348

(56) References Cited

U.S. PATENT DOCUMENTS

| | | | |
|---|---|---|---|
| 4,686,492 A | * | 8/1987 | Grellmann et al. ............ 333/33 |
| 4,891,686 A | * | 1/1990 | Krausse, III ................. 174/252 |
| 6,373,447 B1 | * | 4/2002 | Rostoker et al. ............. 343/895 |
| 2002/0113525 A1 | * | 8/2002 | Nakao et al. ................ 310/348 |

FOREIGN PATENT DOCUMENTS

| | | |
|---|---|---|
| JP | 07-193450 | 7/1995 |
| JP | 08-193902 | 7/1996 |
| JP | 10-150137 | 6/1998 |
| JP | 2000-013165 | 1/2000 |
| JP | 2000-286662 | 10/2000 |

\* cited by examiner

*Primary Examiner*—David Nelms
*Assistant Examiner*—Long Tran
(74) *Attorney, Agent, or Firm*—Hogan & Hartson, LLP

(57) ABSTRACT

An apparatus in which a device electrode pad in an electronic device and a connecting conductor pattern in a substrate are connected to each other through a plurality of wire thin lines which differ from one another in mechanical characteristic frequencies. Even if the frequency of vibration applied to the apparatus from the exterior coincides with the characteristic frequency of the given wire thin line so that the wire thin line is broken, it does not coincide with the characteristic frequency of the other wire thin line. Accordingly, no resonance phenomenon occurs in the other wire thin line, thereby reducing a probability that the wire thin line is broken.

13 Claims, 5 Drawing Sheets

னApparatus CARRYING ELECTRONIC DEVICE

This application is based on application No. 2002-200395 filed in Japan, the content of which is incorporated hereinto by reference.

BACKGROUND OF THE INVENTION

1. Field of the Invention

The present invention relates to an apparatus in which an electronic device is carried on a substrate, and the electronic device and the substrate are connected to each other by a wire.

2. Description of the Related Art

An example of an apparatus in which an electronic device is connected to a substrate by wire bonding is a surface acoustic wave resonator 100 shown in FIG. 8. The surface acoustic wave resonator 100 includes a surface acoustic wave device 110 as an electronic device, a substrate 120, and a metal cover 130.

In the surface acoustic wave device 110, a vibrating electrode pattern 111 and a device electrode pad 112 are formed on a piezoelectric substrate composed of quartz crystal, lithium niobate, or the like.

A cavity 121 carrying the surface acoustic wave device 110 is formed in the substrate 120, a step 123 having a connecting conductor pattern 122 formed therein is provided inside the cavity 121, and a seal ring 124 for sealing is attached to a portion surrounding an opening of the cavity 121. The connecting conductor pattern 122 is so constructed as to be electrically connected to a terminal electrode 125 formed on an outer surface of the substrate 120 through an internal wiring pattern, a via hole conductor, or the like formed in the substrate 120.

The device electrode pad 112 and the connecting conductor pattern 122 are connected to each other by a wire thin line 140. Although the wire thin line 140 is fixed to the device electrode pad 112 and the connecting conductor pattern 122 in bonding portions at both its ends, its arch-shaped wired portion is in a free state where there is no restraint inside the cavity 121.

The above-mentioned surface acoustic wave resonator 100 is frequently subjected to ultrasonic vibration when or after it is mounted on a mother board or the like of electronic equipment. For example, in processes such as a flux washing process after reflow soldering, ultrasonic resin welding for fixing a substrate or parts, and wire bonding further performed for connection from the mother board to an external circuit, ultrasonic vibration of 15 KHz to 60 KHz is generally used. Accordingly, the ultrasonic vibration is also applied to the surface acoustic wave resonator 100.

The above-mentioned surface acoustic wave resonator 100 may, in some cases, be used as an in-vehicle part. In this case, significantly strong vibration such as the vibration of the engine or the vibration at the time of traveling is applied over a long time period. Therefore, the surface acoustic wave resonator 100 is used under significantly severe conditions which cannot be compared with a normal household part.

When such vibrations are applied, the arch-shaped wired portion in a free state where there is no restraint of the wire thin line 140 vibrates in the above-mentioned conventional surface acoustic wave resonator 100. The vibration of the wire thin line 140 can be grasped as the vibration of a string whose both ends are fixed. At this time, when the frequency of the applied vibration and the characteristic frequency of the wire thin line 140 coincide with each other, the wire thin line 140 resonates with the applied vibration. As a result, the amplitude of vibration of the wire thin line 140 is significantly increased exponentially, and the vibration is continued.

Consequently, elastic fatigue occurs in the wire thin line 140, thereby causing the possibility that there occur situations where the wire thin line 140 is broken, so that its electrical connection is interrupted. Particularly in the case of the in-vehicle part, the breaking and the disconnection may lead to an extremely grave and fatal accident.

An advantage of the present invention is to provide an apparatus carrying an electronic device, in which high reliability can be ensured without a wire thin line being disconnected by being broken even if ultrasonic vibration at the time of or after mounting on a mother board or strong mechanical vibration of an in-vehicle mount or the like is applied for a long time period.

BRIEF SUMMARY OF THE INVENTION

An apparatus according to the present invention is an apparatus having a substrate and an electronic device carried on the substrate, wherein a connecting conductor pattern is formed in the substrate, a device electrode pad is formed in the electronic device, a plurality of portions in the connecting conductor pattern in the substrate and a plurality of portions in the device electrode pad in the electronic device are respectively connected to each other through a plurality of wire thin lines, and the plurality of wire thin lines differ from one another in mechanical characteristic frequencies in a connected state.

A plurality of connection paths from one device electrode pad to one connecting conductor pattern can be thus constructed by the plurality of wire thin lines. Even if one of the wire thin lines is disconnected, therefore, the connection can be ensured by the remaining wire thin lines, which does not lead to malfunction as the apparatus. That is, a safety design against the disconnection of the wire thin lines is made.

Furthermore, the plurality of wire thin lines differs from one another in mechanical characteristic frequencies in a connected state. Even if the frequency of vibration applied to the apparatus from the exterior coincides with the characteristic frequency of the certain wire thin line, therefore, it does not coincide with the characteristic frequency of the other wire thin line. Accordingly, no resonance phenomenon occurs in the other wire thin line, thereby eliminating the possibility that the other wire thin line is broken.

Furthermore, it is desirable that the mechanical characteristic frequency of the wire thin line basically deviates from n (n is a natural number) times or 1/n times the mechanical characteristic frequency of the other wire thin line. Even if the frequency of vibration applied to the apparatus from the exterior coincides with the characteristic frequency of the given wire thin line, therefore, such a phenomenon that the other wire thin line resonates with a frequency component which is n times or 1/n times the vibration applied from the exterior does not occur, thereby eliminating the possibility that the plurality of wire thin lines are simultaneously broken.

It is preferable that the plurality of wire thin lines differs from one another in at least one selected from the group consisting of the length, the line diameter, and the material. Consequently, the mechanical characteristic frequencies of the plurality of wire thin lines can be reliably made different from one another.

As described in the foregoing, according to the present invention, there can be provided an apparatus in which high reliability can be ensured by minimizing breaking by a resonance phenomenon in a wire thin line even if ultrasonic vibration in a case where an electronic device is mounted on a mother board substrate. Further, according to the present invention, there is provided an apparatus used as an in-vehicle part in which high reliability is ensured by minimizing breaking by a resonance phenomenon in a wire thin line even if strong mechanical vibration in a case where the electronic device is carried by a vehicle is applied for a long time period and holding, even if one wire thin line is broken, connection by the remaining wire thin lines.

The foregoing and other features, aspects and advantages of the present invention will become more apparent from the following detailed description of the present invention when taken in conjunction with the accompanying drawings.

DETAILED DESCRIPTION OF THE INVENTION

Figure 1:
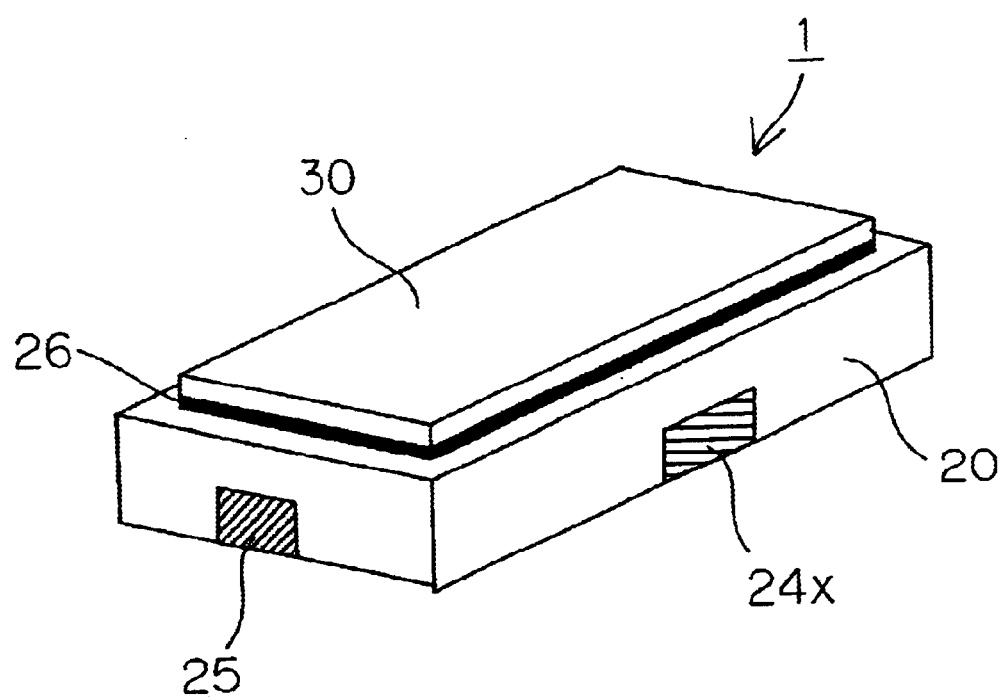
FIG. 1 is an external perspective view of a surface acoustic wave resonator carried on a substrate.
Figure 2:
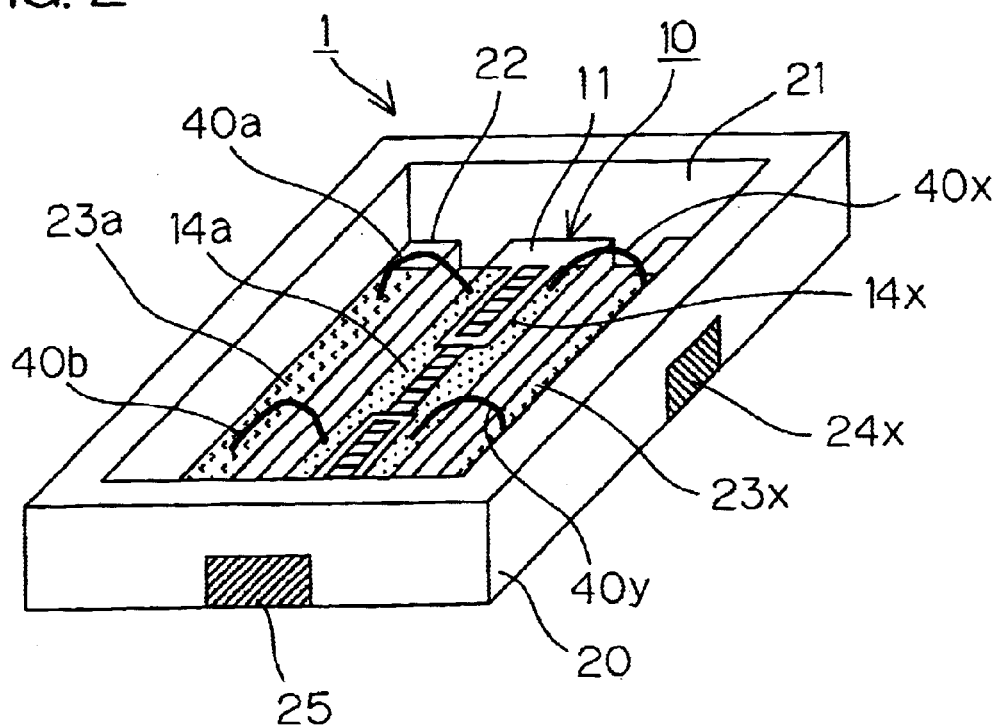
FIG. 2 is an external perspective view of a surface acoustic wave resonator carried on a substrate according to a first embodiment of the present invention, where a metal cover is omitted.

FIG. 1 is an external perspective view of a surface acoustic wave resonator 1 serving as an example of an apparatus carrying an electronic device according to the present invention. FIG. 2 is an external perspective view where a metal cover 30 in the surface acoustic wave resonator 1 is omitted, and FIG. 3 is a plan view where the metal cover 30 in the surface acoustic wave resonator 1 is also omitted.

The surface acoustic wave resonator 1 mainly includes a surface acoustic wave device 10 serving as an electronic device, a substrate 20, and a metal cover 30.

Figure 3:
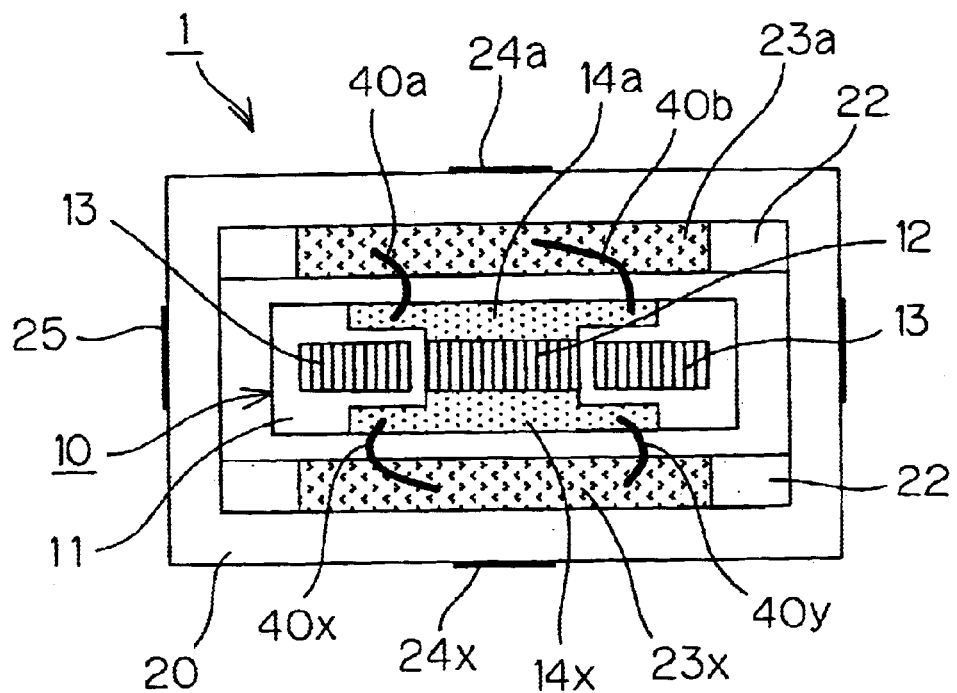
FIG. 3 is a plan view of a surface acoustic wave resonator carried on a substrate according to a first embodiment of the present invention, where a metal cover is omitted.

In the surface acoustic wave device 10, a comb-shaped excitation electrode 12 for generating surface acoustic wave vibration, a comb-shaped reflection electrode 13 for reflecting the surface acoustic wave vibration, an input-side device electrode pad 14a, and an output-side device electrode pad 14x are formed on a main surface of a rectangular piezoelectric substrate 11 composed of lithium tantalum ($LiTaO_3$), lithium niobate ($LiNb_3$), crystal ($SiO_2$) or the like, as shown in FIG. 3. The input-side device electrode pad 14a and the output-side device electrode pad 14x are collectively referred to as a "device electrode pad 14".

The excitation electrode 12 and the reflection electrode 13 are formed by depositing a metal material such as aluminum or gold on the main surface of the piezoelectric substrate 11 to a thickness of 2000 Å, for example, by a film depositing process such as sputtering or evaporation. Although the device electrode pad 14 extending from the excitation electrode 12 is similarly formed by depositing a metal material such as aluminum or gold on the main surface of the piezoelectric substrate 11 by sputtering, evaporation, or the like, similarly to the excitation electrode 12 and the reflection electrode 13, it is formed so as to be thicker to a thickness of 14,000 Å, for example, in order to ensure the connection strength of wire bonding, described later.

The substrate 20 is composed of a ceramic multiplayer substrate obtained by stacking a plurality of ceramic single layer substrates. The substrate 20 has a cavity 21 in a rectangular parallelepiped shape for carrying the surface acoustic wave resonator 10. In the cavity 21, an inner bottom surface for carrying the surface acoustic wave device 10 is formed at the center thereof, and steps 22 raised by a predetermined height from the inner bottom surface are formed on both long sides of the cavity 21.

An input-side connecting conductor pattern 23a and an output-side connecting conductor pattern 23x each composed of a metal material such as gold respectively adhere to upper surfaces of the steps 22 by a method such as plating. Further, an input-side terminal electrode 24a, an output-side terminal electrode 24x, and an earth terminal electrode 25 for external connection are formed on an outer surface of the substrate 20. The input-side terminal electrode 24a and the output-side terminal electrode 24x are respectively connected to the input-side connecting conductor pattern 23a and the output-side connecting conductor pattern 23x by wiring inside the substrate 20. The input-side connecting conductor pattern 23a and the output-side connecting conductor pattern 23x are collectively referred to as a "connecting conductor pattern 23".

A seal ring 26 is formed in a portion surrounding an opening of the cavity 21. The seal ring 26 is composed of an alloy of iron, nickel, cobalt, and so on, and is plated with nickel, gold, or the like, as required.

The metal cover 30 is composed of a metal such as copal or a 42 alloy. The metal cover 30 is put on the opening of the cavity 21, and is subjected to seam welding with the seal ring 26, thereby hermetically sealing the inside of the cavity 21.

Description is herein made of the procedure for carrying and connecting the surface acoustic wave device 10.

First, an adhesive composed of silicon resin or epoxy resin is applied to the inner bottom surface of the cavity 21, the surface acoustic wave device 10 is then put thereon, and the cavity 21 and the surface acoustic wave device 10 are bonded and fixed to each other. Thereafter, the device electrode pads 14 in the surface acoustic wave device 10 and the connecting conductor patterns 23 in the steps 22 are wired and connected to each other by wire bonding using wire thin lines 40a, 40b, 40x, and 40y (they are assigned a number 40 when they are named generically), having a diameter of approximately several ten micrometers, composed of aluminum or gold.

Figure 4:
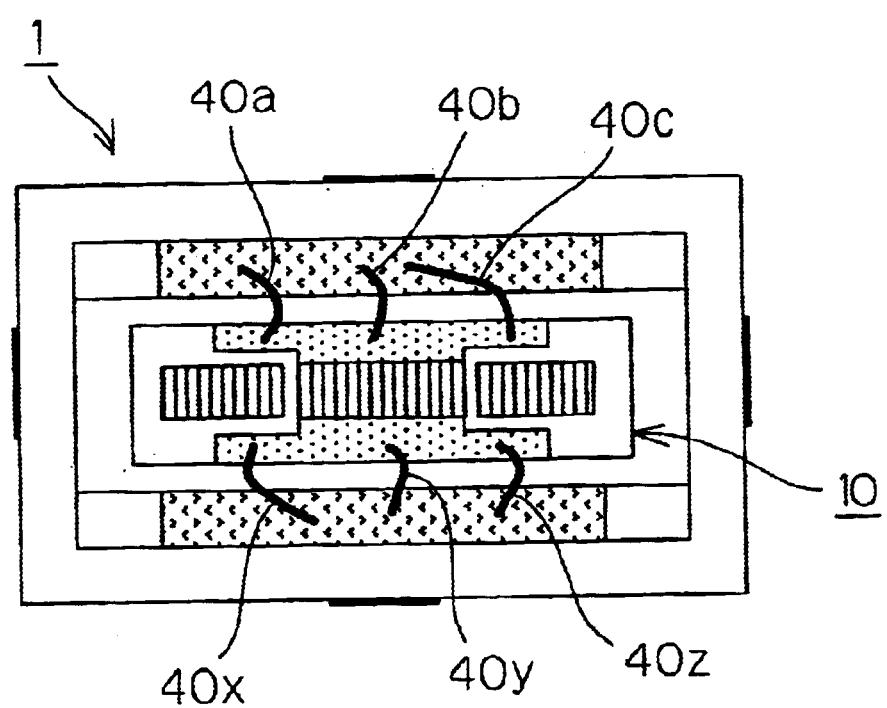
FIG. 4 is a plan view of a surface acoustic wave resonator carried on a substrate according to a second embodiment of the present invention where a metal cover is omitted.

The first characteristics of the present invention in the wire bonding are that the one device electrode pad 14 and the one connecting conductor pattern 23 are connected to each other by a plurality of wire thin lines 40, as shown in FIG. 3. That is, on the input side, the input-side device electrode pad 14a and the input-side connecting conductor pattern 23a are connected to each other by the two input-side wire thin lines 40a and 40b. Similarly, on the output side, the output-side device electrode pad 14x and the output-side connecting conductor pattern 23x are connected to each other by the output-side wire thin lines 40x and 40y. Although in FIG. 3, the input-side and output-side device electrode pads 14a and 14x and the input-side and output-side connecting conductor patterns 23a and 23x are respectively connected to each other by the two input-side wire thin lines 40a and 40b and the two output-side wire thin lines 40x and 40y nearly parallel to each other at positions slightly spaced apart from each other, they may be respectively connected to each other by three input-side wire thin lines 40a, 40b, and 40c and three output-side thin lines 40x, 40y, and 40z, as shown in FIG. 4. Alternatively, they may be respectively connected to each other by four or more wire thin lines. The position where the wire thin line 40 is connected is not limited, provided that it is a position at the same electric potential inside the device electrode pad 14. The position where the wire thin line 40 is connected is not limited, provided that it is also a position at the same electric potential inside the connecting conductor pattern 23.

The second characteristics of the present invention are that the respective mechanical characteristic frequencies of the plurality of wire thin lines 40 connected to one another are made different from one another. If the characteristic frequency of the one wire thin line 40a out of the input-side wire thin lines 40a and 40b is 84 KHz, for example, the characteristic frequency of the other remaining wire thin line 40b is set to 190 KHz, to make the characteristic frequencies different from each other. The same is true for the case of the output-side wire thin lines 40x and 40y.

The third characteristics of the present invention are that when a constant is denoted by n (n is a positive integer), the characteristic frequency of any one of the wire thin lines 40 is not n times or 1/n times the characteristic frequency of the other remaining wire thin line 40. When the characteristic frequency of the one wire thin line 40a is 84 KHz, for example, the characteristic frequency of the other remaining wire thin line 40b is set to have not a characteristic frequency which is n times 84 KHz, i.e., 168 KHz (two times) or 252 KHz (three times) but a characteristic frequency other than the characteristic frequencies. If the characteristic frequency of the one wire thin line 40a is 84 KHz, for example, the characteristic frequency of the other remaining wire thin line 40b is set to 126 KHz (1.5 times) or 210 KHz (2.5 times). The same is true for the case of the output-side wire thin lines 40x and 40y.

The fourth characteristics of the present invention are that in order to change the above-mentioned respective mechanical characteristic frequencies of the wire thin lines 40, the wire thin lines 40 are made different from one another in any one of the length, the line diameter, and the material. That is, if the length of the one wire thin line 40a is 0.8 mm, the length of the other remaining wire thin line 40b is set to 0.5 mm. If the line diameter of the one wire thin line 40a is 30 μm, the line diameter of the other remaining wire thin line 40b is set to 25 μm. Further, if the material of the one wire thin line 40a is aluminum, the material of the other remaining wire thin line 40b is taken as gold. The same is true for the case of the output-side wire thin lines 40x and 40y. Plurality of the changes may be simultaneously carried out. Consequently, the respective characteristic frequencies of the plurality of wire thin lines 40 can be changed. The reason for this is that the wire thin lines 40 connected to one another can be regarded as an arch-shaped string, which can be freely vibrated, whose bonding portion is a node for vibration. Consequently, the characteristic frequency of the wire thin line 40 can be changed by changing the length thereof. The geometrical moment of inertia of the wire thin line 40 is changed by changing the line diameter thereof, so that the characteristic frequency thereof can be changed. Further, the density and the Young's modulus of the wire thin line are changed by changing the material thereof, so that the characteristic frequency thereof can be changed.

The above-mentioned relationship between the length, the line diameter, and the material (density and Young's modulus) of the wire thin line and the characteristic frequency ω thereof can be expressed by the following equation (1) for calculating the characteristic frequency:

$$\omega = 2\pi f = \frac{\lambda^2}{l^2}\sqrt{\frac{EIg}{\gamma A}} \quad (1)$$

where

E: Young's modulus

I: geometrical moment of inertia g: gravitational acceleration

A: cross-sectional area l: length

γ: density

λ: eigenvalue primary vibration: 22.37 secondary vibration: 61.67 ternary vibration: 120.91

Figure 5:
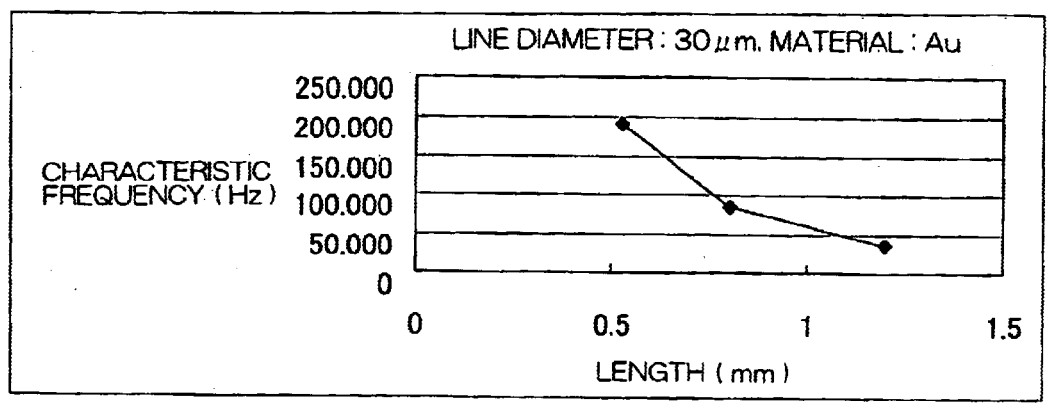
FIG. 5 is a graph showing the relationship between the length and the characteristic frequency of a wire thin line.
Figure 6:
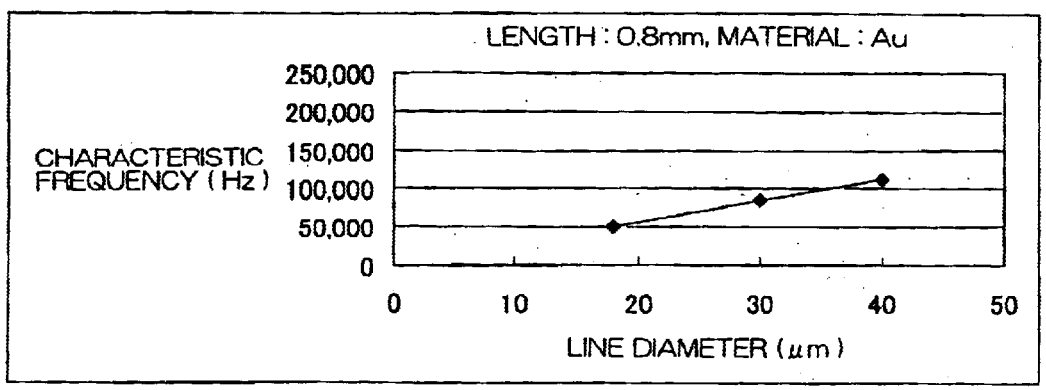
FIG. 6 is a graph showing the relationship between the line diameter and the characteristic frequency of a wire thin line.
Figure 7:
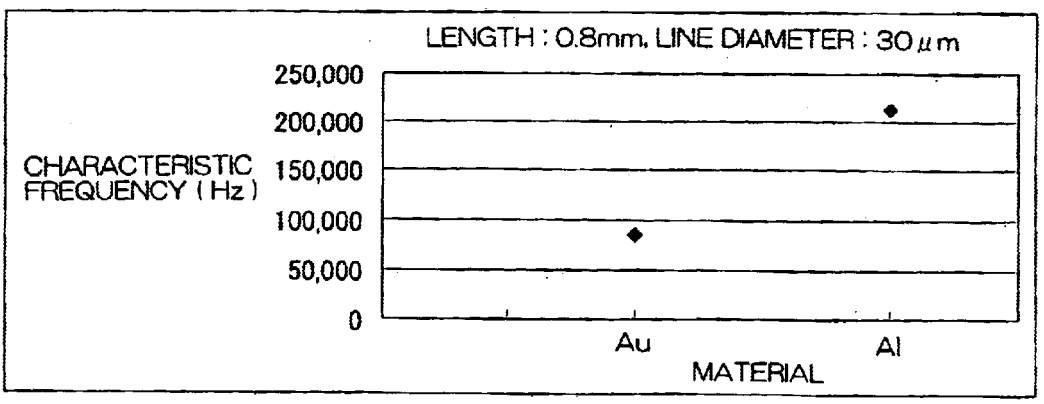
FIG. 7 is a graph showing the relationship between the material and the characteristic frequency of a wire thin line.
Figure 8:
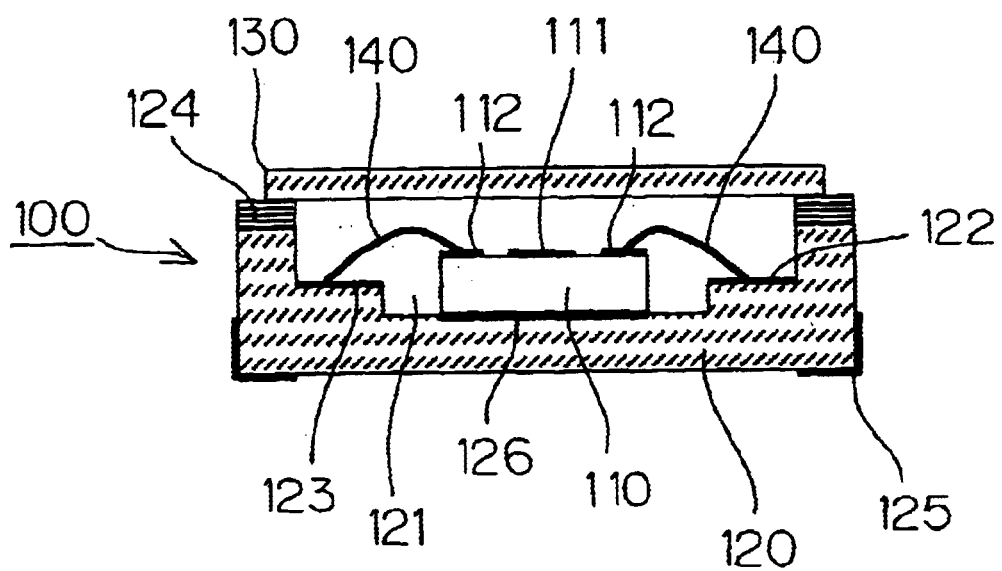
FIG. 8 is an internal sectional view of a conventional surface acoustic wave resonator.

Results obtained by calculating the change in the characteristic frequency of the wire thin line in a case where the length thereof is changed on the basis of the equation (1) are shown in FIG. 5. Results obtained by calculating the change in the characteristic frequency of the wire thin line in a case where the line diameter thereof is changed on the basis of the equation (1) are shown in FIG. 6. Results obtained by calculating the change in the characteristic frequency of the wire thin line in a case where the material thereof is changed on the basis of the equation (1) are shown in FIG. 7. From the results, the respective lengths, line diameters, and materials of the wire thin lines may be selected such that the wire thin lines differ from one another in characteristic frequencies.

In order that the wire thin line has a characteristic frequency other than n times or 1/n times the characteristic frequency, a length and a line diameter corresponding to n times or 1/n times the characteristic frequency are calculated from the equation (1), and the length, the line diameter, and the material of the wire thin line may be selected so as to deviate from the calculated length and line diameter.

Since conditions under which the characteristic frequency of the one wire thin line (referred to as "reference wire thin line") is not an integral multiple of the characteristic frequency of the other wire thin line were concretely calculated, description is made on the basis of Table 1 to Table 4.

The characteristic frequency of the reference wire thin line is denoted by f. The line diameter of the wire thin line is set to 30 μm, and the material thereof is set to Au.

TABLE 1 line diameter: 30 μm material: Au

| | frequency (Hz) | | | length (mm) corresponding to frequency | | |
|---|---|---|---|---|---|---|
| degree | n · f | f − 10% | f + 10% | center value | f − 10% | f + 10% |
| 3 · f | 251,526 | 226,373 | 276,679 | 0.462 | 0.487 | 0.440 |
| 2 · f | 167,684 | 150,916 | 184,452 | 0.566 | 0.596 | 0.539 |
| f | 83,842 | 75,458 | 92,226 | 0.800 | 0.843 | 0.763 |

Table 1 shows the range of the length of the wire thin line for the characteristic frequency of the wire thin line to be within ±10% of the higher-order (1 f, 2 f, 3 f) of the characteristic frequency f of the reference wire thin line. A margin of around 10% is set for the higher-order of the characteristic frequency f to make the effect of preventing resonance in the wire thin line more reliable.

As apparent from Table 1, the characteristic frequency f of the reference wire thin line in a case where the length thereof is 0.8 mm is 83,842 Hz. The length of the reference wire thin line which corresponds to a characteristic frequency within ±10% of 83,842 Hz is in a range of 0.763 mm to 0.843 mm.

The secondary higher harmonic frequency 2 f is 167,684 Hz, and the length of the wire thin line which corresponds to a characteristic frequency within ±10% of 167,684 Hz is in a range of 0.539 mm to 0.596 mm. The ternary higher harmonic frequency 3 f is 251.526 Hz, and the length of the wire thin line which corresponds to a characteristic frequency within ±10% of 251.526 Hz is in a range of 0.440 mm to 0.487 mm. It is preferable that the length of the wire thin line is a suitable length excluding the lengths in these ranges.

TABLE 2 safety area of length (mm)

0.488~0.538
0.597~0.762

Consequently, the safety range of the length of the wire thin line for preventing the characteristic frequency of the wire thin line from not being n times the characteristic frequency of the reference wire thin line is a range other than the above-mentioned ranges of 0.763 mm to 0.843 mm, 0.539 mm to 0.596 mm and 0.440 mm to 0.487 mm. That is, as shown in Table 2, a range of 0.488 mm to 0.538 mm and a range of 0.597 mm to 0.762 mm are recommended ranges of the length.

TABLE 3 length: 0.8 mm material: Au

| | frequency (Hz) | | | line diameter (mm) corresponding to frequency | | |
|---|---|---|---|---|---|---|
| degree | n · f | f − 10% | f + 10% | center value | f − 10% | f + 10% |
| 3 · f | 251,526 | 226,373 | 276,679 | 0.089 | 0.080 | 0.098 |
| 2 · f | 167,684 | 150,916 | 184,452 | 0.060 | 0.053 | 0.066 |
| f | 83,842 | 75,458 | 92,226 | 0.030 | 0.027 | 0.033 |

Table 3 shows the range of the line diameter of the wire thin line for the characteristic frequency of the wire thin line to be within ±10% of the higher-order (1 f, 2 f, 3 f) of the characteristic frequency f of the reference wire thin line in a case where the length of the wire thin line is set to 0.8 mm, and the material thereof is set to Au.

As apparent from Table 3, the characteristic frequency f of the reference wire thin line in a case where the line diameter thereof is 0.03 mm (30 μm) is 83,842 Hz. The line diameter of the wire thin line which corresponds to a characteristic frequency within ±10% of 83,842 Hz is in a range of 0.027 mm to 0.033 mm.

The secondary higher harmonic frequency 2 f is 167,684 Hz, and the line diameter of the wire thin line which corresponds to a characteristic frequency within ±10% of 167,684 Hz is in a range of 0.053 mm to 0.066 mm. The ternary higher harmonic frequency 3 f is 251.526 Hz, and the line diameter of the wire thin line which corresponds to a characteristic frequency within ±10% of 251.526 Hz is in a range of 0.080 mm to 0.098 mm.

TABLE 4 safety area of line diameter (mm)

0.034~0.052
0.067~0.079

Consequently, the safety range of the line diameter of the wire thin line for preventing the characteristic frequency of the one wire thin line from not being n times the characteristic frequency of the other wire thin line is a range other than the above-mentioned ranges of 0.027 mm to 0.033 mm, 0.053 mm to 0.066 mm and 0.080 mm to 0.098 mm. That is, as shown in Table 4, a range of 0.034 mm to 0.052 mm and a range of 0.067 mm to 0.079 mm are recommended ranges of the line diameter.

The dimensional ranges of the respective safety areas of the length and the line diameter of the wire thin line are limited to the ranges as shown in Table 2 and Table 4, thereby making it possible to avoid resonance by the higher-order of the characteristic frequency of the reference wire thin line.

Although in the above-mentioned embodiment, description was made of the apparatus carrying the surface acoustic wave device as an electronic device, another electronic device such as a semiconductor chip may be used in addition to the surface acoustic wave device. The present invention is widely applicable to an electronic device carried by a wiring substrate to a wire thin line for signals connected to the wiring substrate or another wiring substrate.

Although the present invention has been described and illustrated in detail, it is clearly understood that the same is by way of illustration an example only and is not to be taken by way of limitation, the spirit and scope of the present invention being limited only by the terms of the appended claims.

What is claimed is:

1. An apparatus, comprising:
   a connecting conductor pattern formed on a substrate;
   a device electrode pad formed on an electronic device; and
   a plurality of wire thin lines respectively connecting a plurality of portions on the connecting conductor pattern on the substrate and a plurality of portions on the device electrode pad on the electronic device, wherein the plurality of wire thin lines differ from one another in mechanical characteristic frequencies in their connected states such that when one of the plurality of wire thin lines resonates with exterior vibrations and breaks, others of the plurality of wire thin lines do not resonate.

2. The apparatus according to claim 1, wherein the plurality of wire thin lines differ from one another in at least one of a length, a line diameter, and material.

3. The apparatus according to claim 1, which is used as an in-vehicle part.

4. The apparatus according to claim 1, wherein the mechanical characteristic frequencies of the plurality of wire thin lines differ by 10% or more.

5. An apparatus, comprising:

a connecting conductor pattern formed on a substrate;

a device electrode pad formed on an electronic device; and a plurality of wire thin lines respectively connecting a plurality of portions on the connecting conductor pattern on the substrate and plurality of portions on the device electrode pad on the electronic device, wherein the plurality of wire thin lines differ from one another in mechanical characteristic frequencies in their connected states, wherein the mechanical characteristic frequency of one of the plurality of wire thin lines is basically a frequency other than n (n being a natural number) times or 1/n times the mechanical characteristic frequency of the other wire thin lines.

6. The apparatus according to claim 5, wherein the plurality of wire thin lines differ from one another in at least one of a length, a line diameter, and material.

7. The apparatus according to claim 5, which is used as an in-vehicle part.

8. The apparatus according to claim 5, wherein the mechanical characteristic frequencies of the plurality of wire thin lines differ by 10% or more.

9. An apparatus comprising:

a connecting conductor pattern formed on a substrate;

a device electrode pad formed on an electronic device; and means for connecting a plurality of portions on the connecting conductor pattern on the substrate and a plurality of portions on the device electrode pad on the electronic device, wherein the means for connecting differ in mechanical characteristic frequencies in a connected states such that when one of the means for connecting resonates with external vibrations and breaks, others of the means for connecting do not resonate.

10. A manufacturing method for a carrying electronic device, comprising:

forming a connecting conductor pattern on a substrate;

forming a device electrode pad on an electronic device;

connecting a plurality of portions on the connecting conductor pattern on the substrate and a plurality of portions on the device electrode pad on the electronic device with a plurality of wire thin lines; and arranging the plurality of thin lines such that the plurality of thin lines differ from one another in mechanical characteristic frequencies in their connected states such that when one of the plurality of thin lines resonates with external vibrations and breaks, others of the plurality of thin lines do not resonate.

11. The method according to claim 10, further comprising arranging the plurality of thin lines to differ from one another in at least one of a length, a line diameter and material.

12. The method according to claim 10, further comprising arranging the plurality of thin lines connecting the plurality of portions on the connecting conductor pattern and the plurality of portions on the device electrode pad parallel to each other at positions spaced apart from each other.

13. The method according to claim 10, wherein the mechanical characteristic frequencies of the plurality of thin lines differ by 10% or more.

* * * * *